United States Patent [19]

Frederickson

[11] Patent Number: 5,208,834
[45] Date of Patent: May 4, 1993

[54] LEXICOGRAPHICAL ENCODING AND DECODING OF STATE-DEPENDENT CODES

[75] Inventor: Lyle J. Frederickson, Sunnyvale, Calif.

[73] Assignee: International Business Machines Corporation, Armonk, N.Y.

[21] Appl. No.: 669,784

[22] Filed: Mar. 15, 1991

[51] Int. Cl.[5] .............................................. H04B 14/04
[52] U.S. Cl. ......................................... 375/25; 375/18
[58] Field of Search ........................ 375/25, 58, 60, 99, 375/94, 37, 39, 18; 360/41; 341/69, 59; 371/43, 37.1

[56] References Cited

U.S. PATENT DOCUMENTS 4,870,414  9/1989  Karabed et al. ....................... 341/59
4,888,779  12/1989  Karabed et al. ....................... 371/43

OTHER PUBLICATIONS

D. T. Tang and L. R. Bahl, "Block Codes for a Class of Constrained Noiseless Channels", Information Control, No. 17, 1970.
G. F. M. Beekner and K. A. S. Immink, "A Generalized Method for Encoding and Decoding Run-Lenth-Limited Binary Sequences", IEEE Transactions on Information Theory, vol. IT-29, No. 5, 1983.
R. F. Lyon, IEEE Transactions on Communications, COM-21, 1438, 1973.
K. A. S. Immink, "Spectrum Shaping with Binary $DC^2$-Constrained Codes" Phillip Journal of Research, vol. 40, No. 1, 1985.
"Principle of Digital Communication and Coding", Andrew G. Viterbai, McGraw Hill, 1979, pp. 227-272.

Primary Examiner—Curtis Kuntz
Assistant Examiner—Tesfaldet Bocure
Attorney, Agent, or Firm—Henry E. Otto, Jr.

[57] ABSTRACT

A method and apparatus for (1) reducing storage requirements by use of novel encoding/decoding lexicographically code and decode state-dependent codes, and (2) locally reordering coded subsequences to permit direct NRZ coding, which is especially desirable when using PRML sequence detection.

21 Claims, 6 Drawing Sheets

LEXICOGRAPHICAL ENCODING AND DECODING OF STATE-DEPENDENT CODES

This invention relates to methods for transmitting binary digital data over binary storage channels, such as peak detection channels and partial response channels using maximum likelihood (PRML) sequence detection. More particularly, it relates to a method for (a) reducing storage when lexicographically coding state-dependent codes and (b) locally reordering coded subsequences to permit direct non-return-to-zero (NRZ) coding, which is especially desirable when using PRML sequence detection.

BACKGROUND OF THE INVENTION

The following prior art references are considered by applicant to be most pertinent to the present invention;

[A] D. T. Tang and L. R. Bahl, "Block Codes for a Class of Constrained Noiseless Channels," Information Control, No. 17, 1970.

[B] G. F. M. Beenker and K. A. S. Immink, "A Generalized Method for Encoding and Decoding Run-Length-Limited Binary Sequences," IEEE Transactions on Information Theory, vol. IT-29, No. 5, 1983.

[C] R. F. Lyon, "Two Level Block Encoding for Digital Transmission", IEEE Transactions on Communications, Com-21, 1438, 1973.

[D] K. A. S. Immink, "Spectrum Shaping with Binary $DC^2$-constrained Codes," Phillip Journal of Research, Vol. 40, No. 1, 1985.

[E] R. L. Adler, D. Coppersmith and M. Hassner, "Algorithms for Sliding Block Codes", IEEE Transactions on Information Theory, Vol. IT-29, No. 11, 1983.

In a block code with rate m/n, m-bit input strings are encoded into n output channel bits at a time with a fixed mapping.

Reference [A] first considered the application of lexicographical methods to encode and decode block codes with a (d, k) constrained sequence; i.e., codes expressed in non-return-to-zero increment (NRZI) notation, wherein run lengths have at least d and a maximum of k $\emptyset$'s between 1's.

The teachings of Reference [A] were extended by Reference [B] to improve the efficiency of block code concatenation; by Reference [C] to include direct current (dc)-free constrained block codes and disclose a practical embodiment thereof; and by Reference [D] to higher order dc-null block codes. All of these references employed block codes and used a universal ordering system wherein each codeword is in a fixed position in an ordered list.

Reference [D] refers to the possibility of state-dependent codes for improved code rates and calculates bounds for these code rates. There is no teaching of employing a state-dependent code in a lexicographical coding technique.

Reference [E] describes how sliding block codes are derived. From these codes an appropriate subset of (d,k) modulation sequences is determined for a preselected rate m/n code.

Encoding an arbitrary m-bit binary sequence to an n-bit (d,k) sequence could be accomplished through the use of a lookup table with $2^m$ n-bit entries, with the encoder mapping arbitrarily chosen. Decoding could be accomplished using a table with $2^n$ m-bit entries which inverts the encoder mapping and recognizes any unused n-bit sequences, which are presumably flagged as invalid using an additional output bit. However, in many systems, storage of large tables is prohibitively costly, and it is therefore desirable to replace large tables with smaller size tables and some additional logic functions. This can be accomplished by use of lexicographical coding methods.

Lexicographical (or enumerative) coding refers to ordering coded sequences, much in the same way as a dictionary orders words so that they may be found easily. In magnetic recording, coded sequences come from a binary alphabet, and generally have the above described (d,k) constraints.

It is known that the use of state-dependent codes can improve the code rate over relatively short block codes. In attempting to apply lexicographical coding methods to state-dependent codes, it is necessary to contend with the problem that various code states may allow different sets of codewords. A universal ordering may include sequences which are not valid outputs from certain states. One solution is to employ separate encoders and decoders for each state, each using its own ordering, at the expense of multiplying the table size by the number of states.

There is a need for an efficient method for reducing storage by merging lookup tables for lexicographical coding of state-dependent (rather than block) codes, reducing hardware and speeding up decoding.

SUMMARY OF THE INVENTION

Toward this end and according to the invention, a method and apparatus are disclosed for (1) reducing storage requirements by use of novel encoding/decoding algorithms which lexicographically code and decode state-dependent codes; and (2) locally reordering subsequences to permit direct NRZ coding, which is especially desirable when using a Viterbi detector for PRML sequence detection.

A block of n user bits in a state-dependent code is lexicographically coded by providing a coding trellis having a plurality of sets of states, each state in each set having a respective threshold equal to the number of valid code subsequences from that particular state to the end of the trellis. The thresholds corresponding to a succession of then current states are recursively used to determine a path to a succession of corresponding next successor states in the trellis and provide a succession of coded bits until the block of n user bits has been encoded.

The n-bit input string of coded bits in the state-dependent code is lexicographically decoded into the original n-bit block of user bits by determining a path of successive current states through the coding trellis using a succession of the coded bits. The thresholds for a succession of current states are selectively combined to provide the n-bit block of user bits in decoded form.

When encoding a binary input string into encoded subsequences to provide an output in NRZ representation, if a choice of preselected code paths between the states is offered, the encoded subsequences are locally reordered. This reordering gives preference to a successor state that permits concatenation of a most recent encoded subsequence with all subsequences from the successor state to the end of the coding trellis that do not violate preselected modulation constraints.

A coded sequence which has passed through a partial response channel and has been corrupted by noise may be decoded into a binary output without intermediate conversion into a NRZI representation by determining in NRZ representation a maximum likelihood estimate of said coded sequence, and then directly decoding the NRZ representation into the binary output.

DESCRIPTION OF PREFERRED EMBODIMENTS

Figure 1:
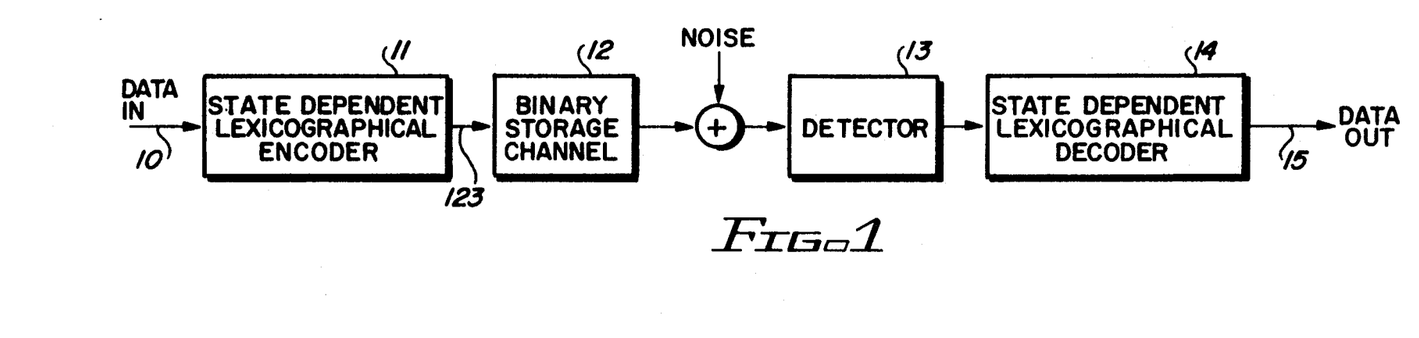
FIG. 1 is a block diagram of one embodiment of a magnetic recording apparatus embodying the invention.

At illustrated in FIG. 1, input data, in the form of binary code strings, is transmitted from a bus 10 to a state-dependent lexicographical encoder 11. Encoder 11 produces a binary code sequence in NRZI or NRZ notation which serves as input to a channel 12. In NRZI notation, a "1" represents a transition between magnetic saturation levels and a "∅" represents no transition; whereas in NRZ notation, a "1" represents one level of magnetic saturation and a "∅" represents the other level of saturation.

This NRZI or NRZ code sequence satisfies modulation constraints appropriate to the kind of binary storage channel being used. A channel output sequence is generated by channel 12. This output sequence, which frequently contains noise, is detected at the channel output by a detector 13, such as a peak detector or a Viterbi detector. This detector chooses the most probable code sequence from the channel output sequence.

According to an important feature of the invention, a state-dependent lexicographical decoder 14 is used to decode the code string from detector 13 into a binary data output in bus 15.

Applicant's state-dependent lexicographical decoder 14 performs coding operations based on following a path from state to state in a trellis. Whenever a state is reached in the coding algorithms which permits a choice, a local reordering of coded subsequences is performed. This reordering is based on the concatenation of the path which was taken to arrive at the current state and the various successor paths which can be taken from that state. For each successor state, the number of subsequences which, by themselves, meet all of the modulation constraints as ending subsequences is stored in a table, preferably in a programmable read only memory. The coding hardware examines the ending bit taken in its path to the current state, and gives preference to the successor state which permits concatenation of all its subsequences without violation of the modulation constraints. It then looks up the number t of subsequences which, by themselves, meet all of the modulation constraints as ending subsequences for the preferred successor state. Coding proceeds recursively by (i) comparing a number to be encoded to the number t to determine the next trellis state and the output of encoder 11, and (ii) modifying said number for the next iteration.

NRZI Implementation

Assume now that binary data has been encoded by state-dependent encoder 11 into an NRZI code string, and that detector 13 is a peak detector which in conjunction with decoder 14 decodes the NRZI code string into the original binary data.

Figure 2:
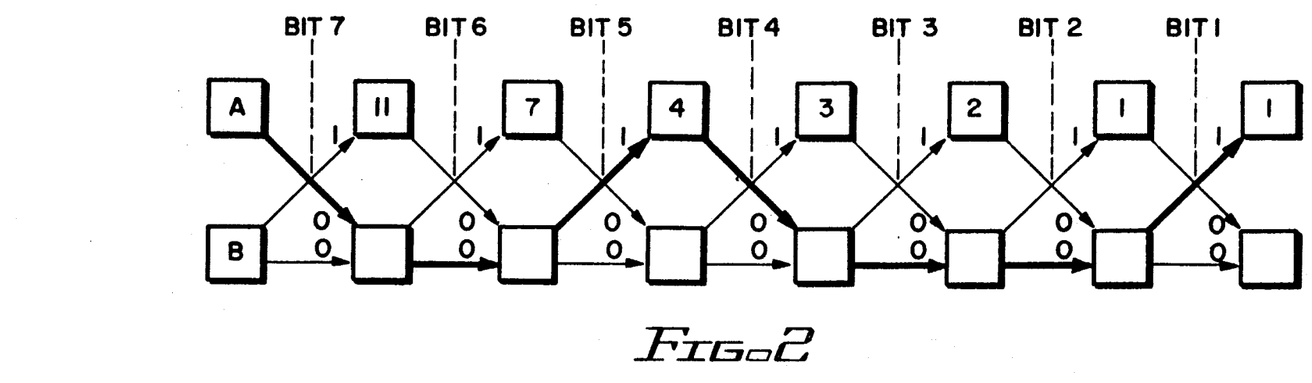
FIG. 2 is a state transition diagram showing a (1,5) coding trellis for a rate (4,7) NRZI state-dependent code.

FIG. 2 is a state transition diagram showing a state-dependent (d,k)=1,5 coding trellis in NRZI notation where the (d,k) constraint requires that each "1" be separated by at least one "∅" and at most five "∅'s." The coding functions are performed with two sets, labelled A and B, of states which correspond, respectively, to the last bit being an NRZI "1" and "∅". These state sets A,B enforce the local d constraint via the state interconnections, and the k constraint is enforced via entries for the two state sets.

For example, the subsequences corresponding to state sets A and B consist of subsequences of length 7 generated using a conventional state diagram for a (d,k)=(1,5) constraint analogous to that shown and described in connection with FIG. 7 of Reference [E] for the (d,k)=(2,7) constraint. The subsequences for state set A consist of those beginning in state 0 (the state corresponding to a preceding symbol equal to a "1") and ending in state 0, 1, 2, or 3. The subsequences for state set B consist of those beginning in state 3 (and therefore also contained in those beginning in state 1 or 2) and ending in states 0, 1, 2 or 3.

Table 1 is a complete list, generated using this code construction technique of Reference [E], of all seven-bit (d,k)=(1,5) sequences for each of the state sets. More specifically the listing for state set A consists of all sequences of seven bits which begin with at least one zero satisfy the (d,k)=(1,5) constraint and end with at most three zeros; whereas the listing for state set B consists of all sequences of seven bits which begin with at most two zeros, satisfy said constraint and end with in at most three zeros. Table 1 lists the allowable sub sequences in order for each state set A and B followed by the number which the algorithm associates with the subsequence.

TABLE 1

| A Subsequences | Number | B Subsequences | Number |
|---|---|---|---|
| 0000010 | 16 | 0010001 | 21 |
| 0000100 | 15 | 0010010 | 20 |
| 0000101 | 14 | 0010100 | 19 |
| 0001000 | 13 | 0010101 | 18 |
| 0001001 | 12 | 0100001 | 17 |
| 0001010 | 11 | 0100010 | 16 |
| 0010001 | 10 | 0100100 | 15 |
| 0010010 | 9 | 0100101 | 14 |
| 0010100 | 8 | 0101000 | 13 |
| 0010101 | 7 | 0101001 | 12 |
| 0100001 | 6 | 0101010 | 11 |
| 0100010 | 5 | 1000001 | 10 |
| 0100100 | 4 | 1000010 | 9 |
| 0100101 | 3 | 1000100 | 8 |
| 0101000 | 2 | 1000101 | 7 |
| 0101001 | 1 | 1001000 | 6 |
| 0101010 | 0 | 1001001 | 5 |
| | | 1001010 | 4 |
| | | 1010001 | 3 |
| | | 1010010 | 2 |
| | | 1010100 | 1 |

TABLE 1-continued

| A Subsequences | Number | B Subsequences | Number |
|---|---|---|---|
|  |  | 1010101 | 0 |

The sixteen subsequences numbered from 0 to 15 in each case will be used in the code because 16 represents the largest power of 2 supported by the (1,5) run length constraint and the block length of the code.

Whenever a subsequence ends with a NRZI "1" (i.e., the coder is in state set A), the local d constraint forces the next output to be a "∅" and the coder makes a forced transition to state set B. When a subsequence ends with a NRZI "∅" (i.e., the coder is in state set B), there is a choice to proceed to state set A or state set B. All of the subsequences from state set A which, by themselves, are valid ending subsequences can be concatenated with the subsequence corresponding to the path which was taken to state set B without violating the d or k constraint. However, some of the subsequences which continue by proceeding to state set B and are valid ending subsequences cause trouble in concatenation, since the combined subsequence would violate the k constraint. Therefore, preference is given to state set A whenever there is a choice, and the reordering in this case is simple. Because the algorithm uses only the stored numbers for preferred state set A, storage is required only for the seven entries for state set A, reflecting the number of valid ending subsequences of each length which begin with a one. The total number of entries in the table is seven for the method herein disclosed. By combining the tables for state sets A and B, the need for two distinct coders has desirably been eliminated.

As earlier noted, Reference [E] describes how sliding block codes are derived (with and without state splitting), and how from these an appropriate subset of (d,k) modulation sequences is determined for a preselected rate m/n code. From this subset of preselected (d,k) modulation sequences the thresholds t are determined.

Assuming now a sliding block code with a (1,5) modulation constraints generated without state splitting.

Table 2 sets forth the number of allowable ending subsequences of length n that begin with a "1," and hence the number of valid ending subsequences from state set A to the end of the coding trellis shown in FIG. 2. These subsequence numbers 11, 7, 4, 3, 2, 1 represent the threshold t for deciding which path to take to the next state. These thresholds T are determined as follows:

TABLE 2

| Bit No. | Valid Ending Sequences Beginning Beginning with a "1" | Thresholds t (No. of Valid Subsequences) |
|---|---|---|
| 7 | 1000001, 1000010, 1000100, 1000101, 1001000, 1001001, 1001010, 1010001, 1010010, 1010100, 1010101 | 11 |
| 6 | 100001, 100010, 100100, 100101, 101000, 101001, 101010 | 7 |
| 5 | 10001, 10010, 10100, 10101 | 4 |
| 4 | 1000, 1001, 1010 | 3 |
| 3 | 100, 101 | 2 |
| 2 | 10 | 1 |
| 1 | 1 | 1 |

Figure 3:
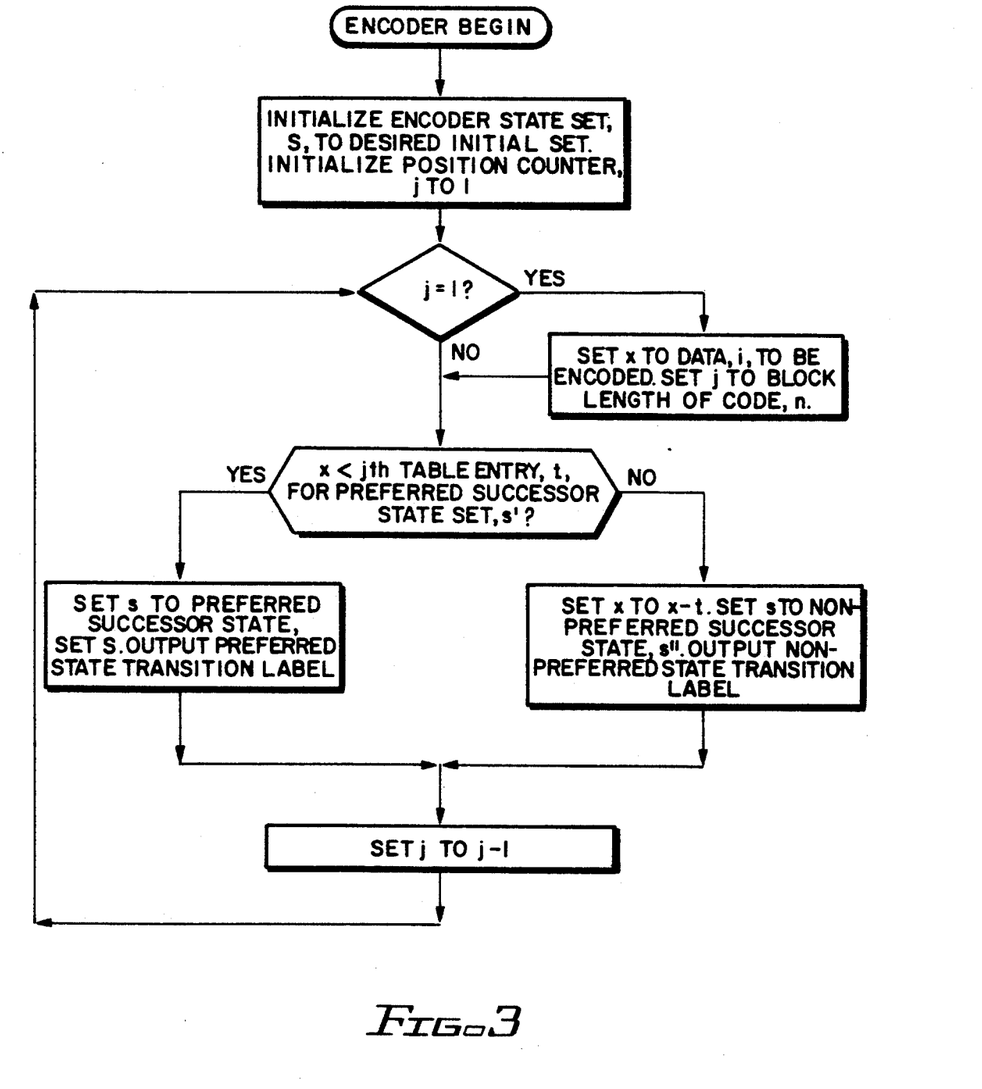
FIG. 3 is a flow chart diagramming the sequence of steps in implementing applicant's encoding algorithm.
Figure 4:
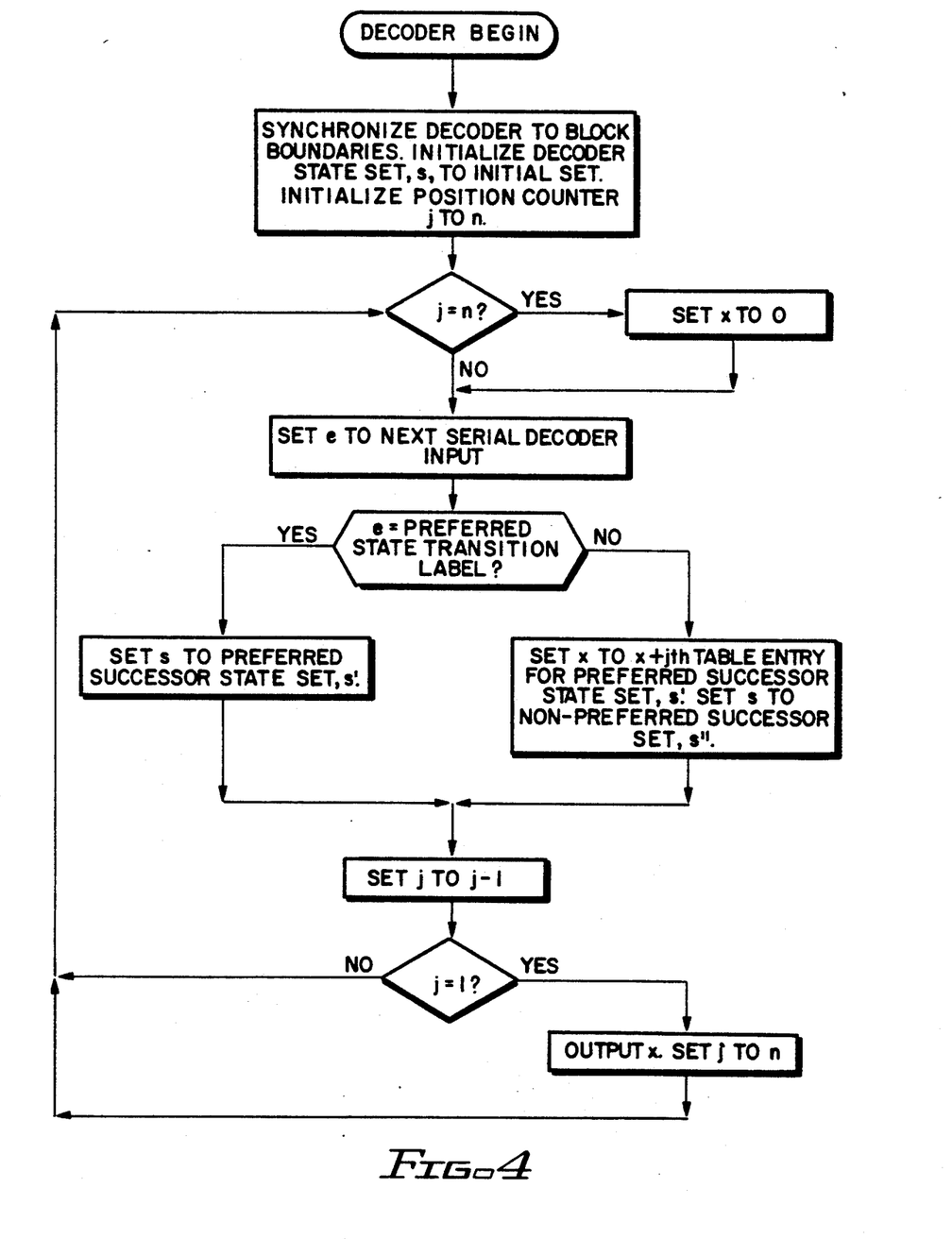
FIG. 4 is a flow chart diagramming the sequence of steps in implementing applicant's decoding algorithm.

FIGS. 3 and 4 depict, respectively, in flow chart form, the encoding and decoding algorithms used in applicant's state-dependent lexicographical decoder 14.

The following examples illustrate the manner in which these encoding and decoding algorithms operate for the NRZI implementation.

(I) To encode decimal 10 to NRZI coded binary 0010001, starting at state set A, the following sequence of operations is performed:

| Bit No. | State Set | x | t | x < t (?) | Next State Set | x − t | NRZI Output |
|---|---|---|---|---|---|---|---|
| 7 | A | 10 | * | DON'T CARE | B | DON'T CARE | 0 |
| 6 | B | 10 | 7 | NO | B | 3 | 0 |
| 5 | B | 3 | 4 | YES | A | DON'T CARE | 1 |
| 4 | A | 3 | * | DON'T CARE | B | DON'T CARE | 0 |
| 3 | B | 3 | 2 | NO | B | 1 | 0 |
| 2 | B | 1 | 1 | NO | B | 0 | 0 |
| 1 | B | 0 | 1 | YES | A | DON'T CARE | 1 |

*Thresholds are stored for state set B only.

To facilitate understanding, the above example to encode 10 will now be described narratively. In FIG. 2 a thickened line denotes the path (beginning in state set A and ending in state set A) selected during encoding of the integer 10. Starting in state set A, for bit 7, there is only one available path; namely to output a "∅" and go to state set B.

For bit 6, from state set B, there are two choices; namely, to output a "1" and go to state set A or output a "∅" and remain in state set B. To determine which to output, the number 10 to be encoded is compared with the threshold 7 for the preferred successor state set A. Since 10≧7, output a "∅" and remain in state set B, and subtract 7 from 10 to provide a result of 3.

For bit 5, the result 3 is compared to the threshold 4 for preferred state set A; and since 3<4, go to state set A and retain the 3. For bit 4, the only output choice from state set A is a "∅", so go to state set B and retain the 3. For bit 3, the retained 3 is compared to the threshold 2 for preferred state set A; and since 3≧2, go to state set B and subtract 2, leaving a resultant 1. For bit 2, this resultant 1 is compared to threshold 1 for preferred state set A; and since 1≧1, go to state set B, and subtract 1, leaving a resultant ∅. Finally, for bit 1, the resultant ∅ is compared to the threshold 1 for preferred state set A; and since ∅<1, go to state set A.

(II) To decode the NRZI coded binary 0010001 back to decimal 10, starting at state set A, the following sequence of operations is performed:

| Bit No. | State Set | Preferred Edge Label (P) | Actual Edge Label (A) (From Channel) | P = A (?) | x | t | x + t |
|---|---|---|---|---|---|---|---|
| 7 | A | 0 | 0 | YES | 0 | * | DON'T CARE |

-continued

| Bit No. | State Set | Preferred Edge Label (P) | Actual Edge Label (A) (From Channel) | P = A (?) | x | t | x + t |
|---|---|---|---|---|---|---|---|
| 6 | B | 1 | 0 | NO | 0 | 7 | 7 |
| 5 | B | 1 | 1 | YES | 7 | 4 | DON'T CARE |
| 4 | A | 0 | 0 | YES | 7 | * | DON'T CARE |
| 3 | B | 1 | 0 | NO | 7 | 2 | 9 |
| 2 | B | 1 | 0 | NO | 9 | 1 | 10 |
| 1 | B | 1 | 1 | YES | 10 | 1 | DON'T CARE |

*Thresholds are stored for state set B only.

The thickened path line in FIG. 2 denotes the path to successive state sets which are selected during decoding. The various steps in decoding should be apparent from (II) and from the narrative description of (I).

NRZ Implementation

Assume now that the state-dependent lexicographical encoder 11 shown in FIG. 2 produces an NRZ binary code sequence which serves as input to partial response channel 12.

The channel output sequence generated by partial response channel 12, which frequently contains noise, is detected at the channel output, preferably by a detector 13 that is known in the art as a Viterbi detector. Detector 13 chooses the most probable code sequence from the channel output sequence. For sake of illustration, it will be assumed that the NRZ code sequences are dc-free (i.e. they have no spectral content at zero frequency) and have a (d,k)=(0,3) constraint and five state sets.

In NRZ notation, the k constraint requires that at most k+1 consecutive like output bits appear in the modulated channel sequence. Given a choice of next channel input bit, the algorithm gives preference to the complement of the last produced channel sequence bit since this would never violate the k constraint. The algorithm therefore performs local reordering, placing those subsequences which begin with the complement of the last produced channel sequence bit at the beginning of the list, and making the preferred edge that which is labelled with the complementary NRZ bit.

Figure 5:
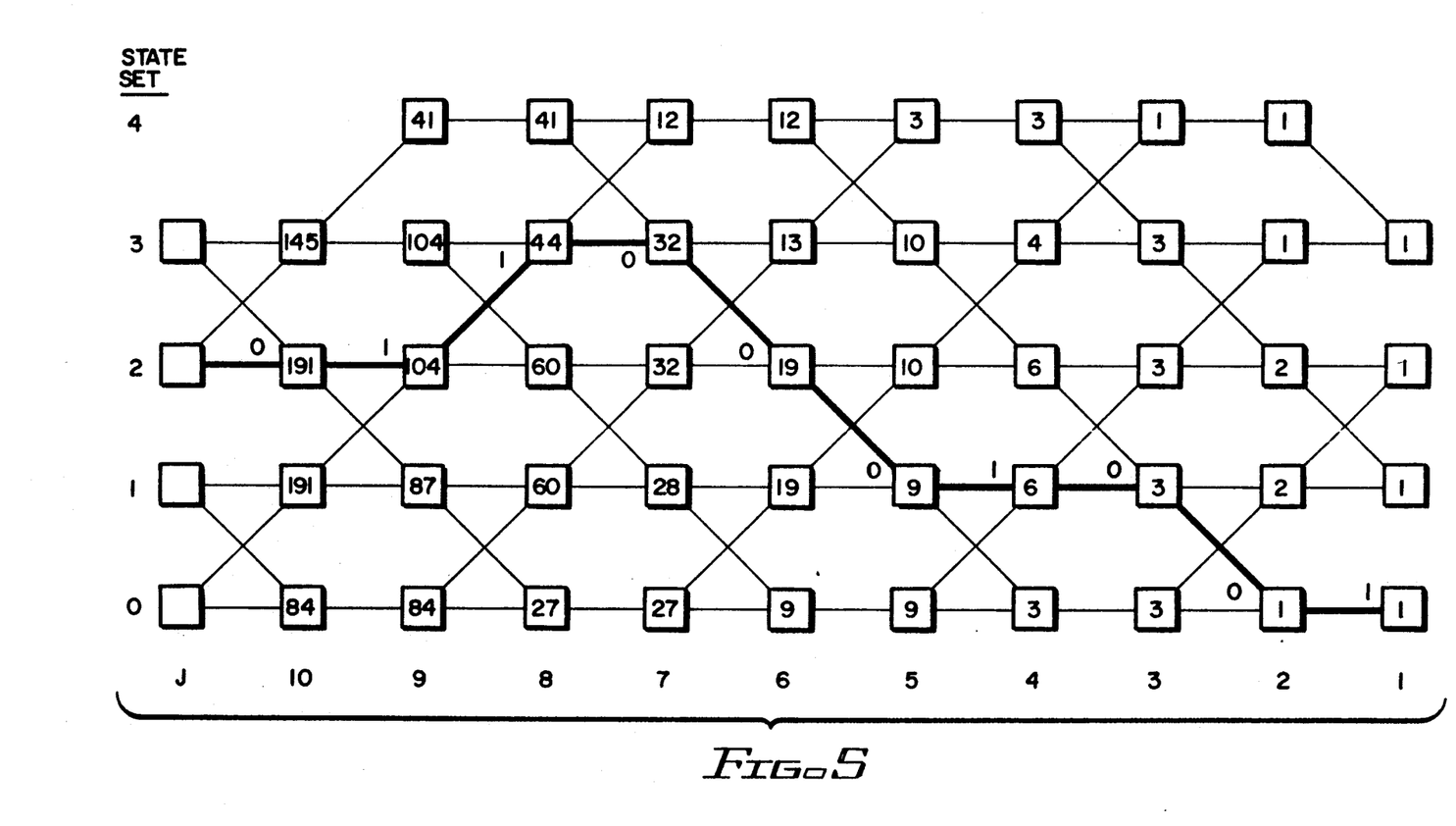
FIG. 5 is a state transition diagram showing a dc-free (0,3) coding trellis for a rate (8,10) NRZ state-dependent code with local reordering.

FIG. 5 illustrates a coding trellis for the code with (d,k)=(0,3) constraint described in this NRZ example. The state sets are designated 0 to 4 respectively. Each state set corresponds to a series of subsequences. To construct the subsequences, a conventional state diagram is used for dc-free sequences in which the maximum running digital sum (RDS) variation is 5. Such a state diagram is shown in FIGS. 2 and 3 of, and described in, commonly assigned U.S. Pat. No. 4,888,779. The states in that state diagram correspond to RDS values 0 and 5. State sets 0–4 in FIG. 5 correspond to subsets of the sequences of length 10 generated from states in the state diagram for the dc-free sequence. The sequences in each of these subsets must satisfy the (d,k)=(0,3) constraint and also must end with at most three identical NRZ bits; i.e., at most two NRZI bits ∅.

More specifically, state sets 0 and 1 represent subsets generated from the state corresponding to an RDS value of 1; however, these sequences must satisfy a (d,k)=(0,3) constraint, and the sequences in state set 0 when preceded by an NRZ bit 1 must generate at most one NRZI bit ∅, and the sequences in state set 1 when precede by an NRZI bit ∅ must generate at most one NRZI bit 1. Similarly, state sets 2 and 3 represent analogous subsets generated from the state corresponding to an RDS value of 3. State set 4 represents the analogous subset generated from the state corresponding to an RDS value of 5, which must be preceded by an NRZ bit 1.

The coding trellis of FIG. 5 is generated in a manner similar to that described above in connection with FIG. 2. From this trellis, it will be seen that the states corresponding to state sets 0 to 3 are valid initial and ending states at codeword boundaries. The trellis indicates 10-bit channel sequences, indexed along the bottom of FIG. 5 to indicate the relative positions of the respective bits. The NRZ bit label for each edge is a "1" if the sum of the state set at the end of the edge and index at the end of the edge is odd, and a "∅" if the sum of the state set and index at the end of the edge is even. This NRZ bit label is determined by taking the XOR of the least significant bit of the state set number and the least significant bit of the index.

Since FIG. 5 is arranged so that complementary bits lead to the same state set, determination of the preferred state set is simple; it is the current state set. The preferred state transition label or edge label is that one which leads to the preferred state set. The non-preferred state set is the current state set minus 1 if the following RZN edge label is a "∅" and is the current state set plus 1 if NRZ edge label is a "1." The next state set is determined by an up/down counter (as hereafter described) whose direction is determined by the NRZ bit label.

The number in each vertex or box in the trellis is the threshold for each state set at that particular position in the 10-bit block i.e., the number of valid sequences from that particular box to the end of the coding trellis for that particular bit position. Since there are at least 256 sequences from each initial state, a rate 8/10 code is produced.

The following examples illustrate how applicant's encoding and decoding algorithms (flow charted in FIGS. 3 and 4, respectively) operate for the NRZ implementation.

(III) To encode decimal 85 to NRE coded binary 0110001001, starting at state set 2, the following sequence of operations is performed:

| Bit No. | State Set | x | t | x < t (?) | Next State Set | x − t | NRZ Output |
|---|---|---|---|---|---|---|---|
| 10 | 2 | 85 | 191 | YES | 2 | DON'T CARE | 0 |
| 9 | 2 | 85 | 104 | YES | 2 | DON'T CARE | 1 |
| 8 | 2 | 85 | 60 | NO | 3 | 25 | 1 |
| 7 | 3 | 25 | 32 | YES | 3 | DON'T CARE | 0 |
| 6 | 3 | 25 | 13 | NO | 2 | 12 | 0 |
| 5 | 2 | 12 | 10 | NO | 1 | 2 | 0 |
| 4 | 0 | 2 | 6 | YES | 1 | DON'T CARE | 1 |
| 3 | 1 | 2 | 3 | YES | 1 | DON'T CARE | 0 |
| 2 | 1 | 2 | 2 | NO | 0 | 0 | 0 |

-continued

| Bit No. | State Set | x | t | x < t (?) | Next State Set | x − t | NRZ Output |
|---|---|---|---|---|---|---|---|
| 1 | 0 | 0 | 1 | YES | 0 | DON'T CARE | 1 |

During encoding, the NRZ output as indicated in (III) above and heretofore stated, will be "∅" if the sum of the bit number and the next state set is even; and "1" if said sum is odd.

For example, to encode 85, initially set x to 85. Starting in state set 2, for bit 10, compare x(85) with t(191), which is the threshold for bit 10 in state set 2. Since x<t, the next state set will remain as state set 2, and x will not be modified for bit 9, compare x(85) to t(104); and again, since x<t, the next state set will remain as state set 2 and x will remain unmodified.

For bit 8, compare x(85) with t(60); since x≧t, x becomes 25 (i.e., 85−60) and the next state set becomes state set 3. Because the sum of the bit number 8 and the state set 2 is 10, which is an even number, 1 is added to the state set number (i.e., 1+2) to change the next state set to state set 3.

For bit 7, x(25) is compared to t(32). Since x<t, the next state set remains as state set 3 and x is not modified. For bit 6, x(25) is compared to t(13). Now, since x≧t, x becomes 12 (i.e., 25−13) and the next state set is changed to state set 2. Because the sum of bit number 6 and the state set 3 is odd, 1 is subtracted from the state set number to change the next state set bits 5,4,3,2, and 1, with the result that the NRZ output will be as indicated in (III).

In FIG. 5 a thickened line denotes the path (beginning in state set 2 and ending in state set ∅) selected by the algorithm during encoding of the integer 85.

(IV) To decode the NRZ coded binary output sequence 0110001001 back to decimal 85, starting at state set 2, the following sequence of operations is performed:

| Bit No. | State Set | Preferred Edge Label (P) | Actual Edge Label (A) (From Channel) | P = A (?) | x | t | x + t |
|---|---|---|---|---|---|---|---|
| 10 | 2 | 0 | 0 | YES | 0 | 191 | DON'T CARE |
| 9 | 2 | 1 | 1 | YES | 0 | 104 | DON'T CARE |
| 8 | 2 | 0 | 1 | NO | 0 | 60 | 60 |
| 7 | 3 | 0 | 0 | YES | 60 | 32 | DON'T CARE |
| 6 | 3 | 1 | 0 | NO | 60 | 13 | 73 |
| 5 | 2 | 1 | 0 | NO | 73 | 10 | 83 |
| 4 | 1 | 1 | 1 | YES | 83 | 6 | DON'T CARE |
| 3 | 1 | 0 | 0 | YES | 83 | 3 | DON'T CARE |
| 2 | 1 | 1 | 0 | NO | 83 | 2 | 85 |
| 1 | 0 | 1 | 1 | YES | 85 | 1 | DON'T CARE |

Since bits 10 and 9 have NRZ actual edge labels ∅ and 1, respectively, which are identical with their corresponding preferred edge labels P, x is unmodified from its initial value of ∅. For bit 8, NRZ actual edge label 1 is not the preferred edge label ∅; the decoder therefore adds to x (∅) the value of the threshold t(60) for the preferred state set (set 2); x becomes 60 and the state set for next bit 7 becomes set 3. The actual edge label NRZ for bit 7 is the preferred edge label ∅, so x remains unmodified. For bits 6 and 5 the NRZ edge labels are both ∅ and do not follow the preferred edge label 1, so thresholds t (13 and 10, respectively) are added to x (now 83), and the next state changes to state set 1. For bits 4 and 3, the NRZ actual edge labels 1 and ∅, respectively, are the preferred edge labels, so x remains unmodified (at 83). For bit 2, the NRZ actual edge label is ∅ and thus does not follow the preferred edge label; so threshold t (2) is added to x (now 85), and the decoder proceeds to state set ∅. For bit 1, the NRZ edge label is the preferred edge label, and so both x and the state set remain unmodified. This sequence is then the 60+13+10+2=85 in the locally reordered list, and the decoder outputs 85.

According to another important feature of the invention, applicant's lexicographical coding algorithms permit direct NRZ coding when detector 13 is a Viterbi detector for partial response maximum likelihood (PRML) decoding. Insofar as applicant is aware, all prior lexicographical coding techniques have been implemented in NRZI format and incur (when used for PRML decoding) increased error propagation.

Description of Encoder 11

Figure 6:
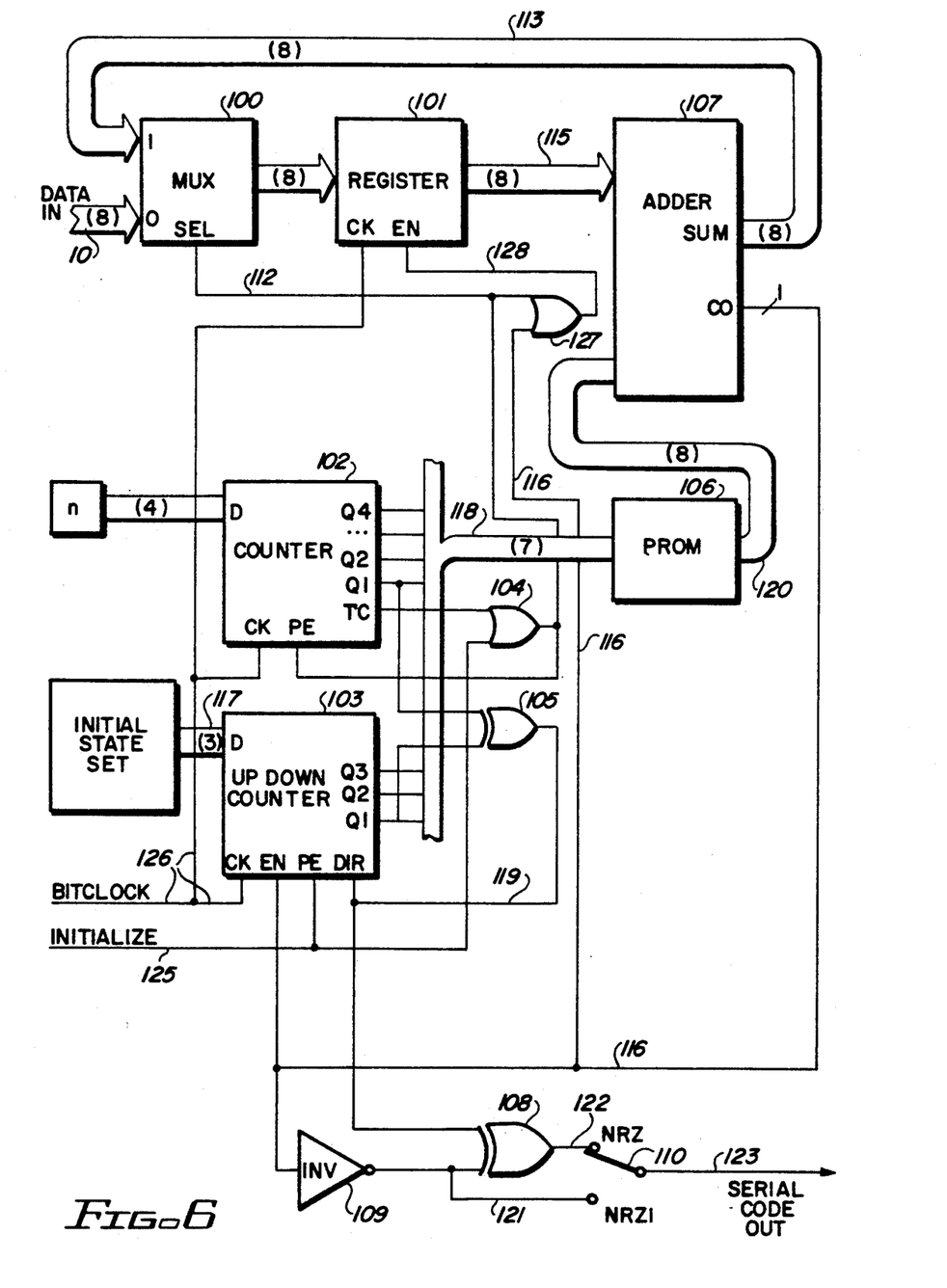
FIG. 6 is a detailed block diagram of a state-dependent lexicographical encoder for implementing the invention.

As illustrated in FIG. 6, and according to the invention, encoder 11 receives an 8-bit parallel data input on bus 10 (FIG. 1). A multiplexer (MUX) 100 selects the contents of either bus 10 (if a select input signal in line 112 is a logical "1") or that of a bus 113 (if said select input is a logical "∅") as its output via a bus 114 to a register 101. Register 101 synchronously loads its output onto bus 115 if its enable input EN in line 128 is a logical "1;" otherwise it retains its previously loaded value.

A counter 102 synchronously counts from n down to "1," the current count being indicated by four binary Q outputs. Terminal count output TC indicates that the current count is at "1." Parallel enable input PE overrides the counting and synchronously loads counter 102 with n.

An up/down counter 103 synchronously counts up, counts down, loads in parallel, or does nothing depending upon which of the following inputs controls:

PE, an overriding parallel load enable, which causes the counter to be loaded with the contents of bus 117;

EN, which enables counting; and

DIR, which determines the direction of counting (up if the signal is a logical "1;" down if a logical "∅").

The three binary Q outputs of counter 103 are combined with the four binary Q outputs of counter 102 to produce a 7-bit output in bus 118.

An OR gate 104 outputs to line 112 the logical OR of either the output TC of counter 102 or that of an external initialize command via line 125. Exclusive OR (XOR) gate 105 outputs to line 119 the logical XOR of the least significant outputs of counters 102 and 103. An OR gate 127 outputs to line 128 the logical OR of line 116 and line 112.

Programmable read only memory (PROM) 106 comprises a lookup table of $2^7$ 8-bit words in size. These words represent the two's complements of the thresholds t. PROM 106 provides an 8-bit output to bus 120. The size of the lookup table in PROM 106 is significantly smaller than the four lookup tables, each containing $2^8$ 10-bit words, that would, according to the prior art, be required for a direct implementation of this four-state-set code using lookup tables and not employing applicant's lexicographical coding technique. It should be noted that, according to a feature of the invention, although PROM 106 is addressed by seven binary inputs, only 48 valid addresses are used in encoding and decoding to provide the 8-bit output in bus 120.

Adder 107 is a binary adder with a carry (overflow) output CO. The sum of the contents of bus 115 and bus 120 appears on bus 113. A logical "1" on CO indicates a successful subtraction with a non-negative result.

XOR gate 108 provides in line 122 a logical exclusive OR'ing (XOR) of the signal in lines 119 and 121; whereas inverter 109 provides in line 121 an inversion of the EN signal in line 116.

Referring now to FIG. 3, in operation, initialization is provided by the external Initialize control signal in line 125 which causes MUX 100 to select the parallel input user data from bus 10 to be encoded, loads counter 102 with n, counter 103 with a desired initial state set, and register 101 with the input user data. Thereafter, loading of counter 102 is controlled by its TC output. Counter 102 counts from n down to "1" repeatedly in synchronism with the channel Bitclock pulse in line 126. The TC output of counter 102 also causes register 101 to reload with new user input data at the end of each block.

Data at the output of register 101 is supplied via bus 115 to adder 107. The appropriate threshold t for the current state set at the current bit index, in two's complement form, is provided in bus 120 via bus 118 and PROM 106. If the contents of bus 115≧bus 120, the carryover CO of adder 107 indicates successful subtraction.

The contents of register 101 is the x in the flow chart (FIG. 3) and claims. If x<t, the carryover CO of adder 107 is a logical "∅," disabling a reload of register 101 and disabling counting in counter 103. It also complements the previous NRZ bit via XOR 108 and inverter 109.

If x≧t, the carryover CO of adder 107 is a logical "1." This causes register 101 to reload with x-t, and counter 103 to count in the direction determined by the previous NRZ bit. It also causes a repetition of the previous NRZ bit in line 122. This process continues until n output bits serially coded in NRZ format are produced in output line 123 with switch 110, as shown in FIG. 6, connecting the output of XOR gate 108 to line 123.

Note that the serial code output in NRZI format can readily be obtained by repositioning switch 110 to its dashed line position to connect line 123 to the output of inverter 109 in bypass of XOR gate 108.

Description of Decoder 14

Figure 7:
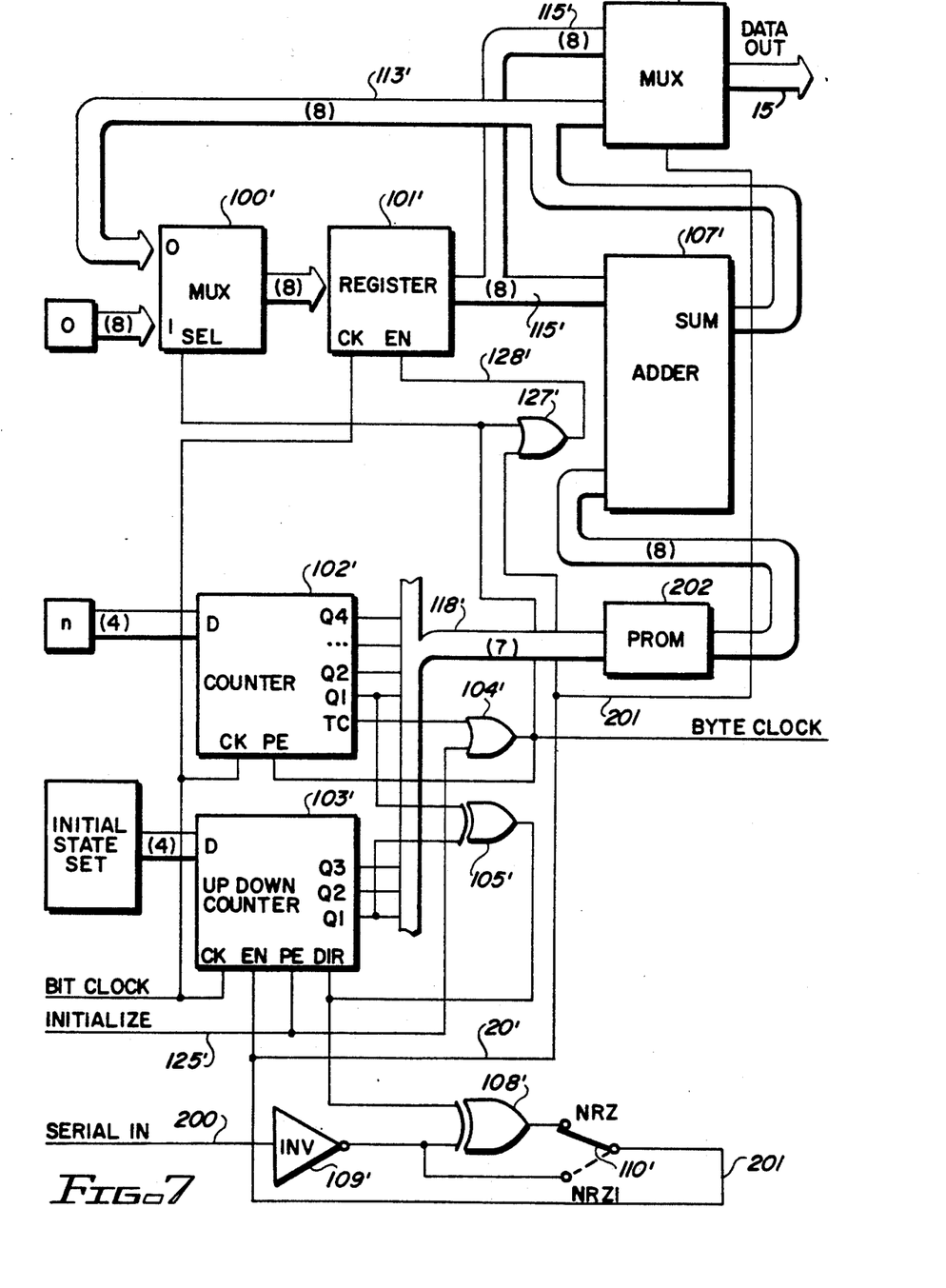
FIG. 7 is a detailed block diagram of a state-dependent lexicographical decoder for implementing the invention.

Referring now to FIG. 7, it will be noted that decoder 14 is substantially identical with encoder 11. Components, busses and lines in decoder 14 which are substantially identical with those of encoder 11 will be denoted by the same reference numerals but primed; whereas items that differ significantly will be renumbered.

Decoder 14 differs from encoder 11 in the following respects. In encoder 11, control signal 116 is provided by the carryover CO of adder 107; whereas in decoder 14, the signal in line 201 is provided by the output of switch 110'. In encoder 11, the input to inverter 109 is provided by the carryover CO of adder 107; whereas in decoder 14, the serial coded channel output from detector 13 (FIG. 1) is input via a line 200 to inverter 109'. PROM 202 in decoder 14 differs from PROM 106 in that the thresholds t are in binary notation in PROM 202, whereas they are in two's complement form in PROM 106. Encoder 11 receives parallel data to be encoded on bus 10, and provides from channel 12 a serial coded output in NRZI or NRZ format in line 123; whereas decoder 14 outputs parallel decoded data onto bus 15. An additional MUX, 203, in the decoder selects either bus 115' or bus 113' as the output of the decoder.

As before, NRZ coded data will be decoded if switch 110' is in the position in which it is shown; whereas NRZI data can be decoded if the switch is in the position denoted by dashed lines.

Referring now to FIG. 4, in operation, initialization is provided by an external Initialize control signal in line 125'. This loads counter 102' with n, counter 103' with the desired initial state, and register 101' with "∅."

The serial coded channel output from detector 13 that is input to line 200 is transmitted via inverter 109', XOR 108', and switch 110' to control whether the value x in register 101' is replaced by x+t. The enable input EN in line 128' to register 101' indicates that the input is not the preferred bit if it is a logical "1;" whereas a logical "∅" indicates the input is the preferred bit. This input bit can be in NRZ or NRZI notation, according to the position of switch 110'. If the signal in line 201 is a "1," the sum of the previous contents x of register 101', and the appropriate threshold t provided by PROM 202, replaces x in register 101'. Also, counter 103' counts in the appropriate direction determined by XOR 105'. However, if the signal in line 201 is a "∅," reloading of register 101' is disabled, and counting at counter 103' is disabled.

This process continues recursively until n serial bits have been processed. On the nth bit, the TC output of counter 102' signals that a decoded byte appears on data out bus 15 and is used as a Byteclock signal via OR gate 104'. This also causes counter 102' to reload with n, and register 101' to reload with zero, in preparation for decoding of the next byte.

It will now be seen that, according to the invention, (1) storage requirements can be significantly reduced by use of novel encoding/decoding algorithms for lexicographically coding and decoding state-dependent codes and (2) whenever a state is reached in the coding algorithms which permits a choice, a local reordering of coded sequences is performed, permitting direct NRZ decoding which is especially desirable when a Viterbi detector is used for PRML decoding.

Appendix A sets forth the essential conditions for local reordering of subsequences as achieved by use of applicant's encoding and decoding algorithms.

While the invention has been shown and described with respect to preferred embodiments thereof, it will be understood by those skilled in the art that changes in form and detail may be made in these embodiments without departing from the scope and teaching of the invention. Accordingly, the method and apparatus herein disclosed are to be considered merely as illustrative, and the invention is to be limited only as specified in the claims.

APPENDIX A

Background

Let $G=(V,E)$ be a directed acyclic graph with edge labels; and let all initial vertices be I and all terminal vertices be T. Assume now that the edges leaving any particular vertex have distinct labels from the set $\{0,1\}$. Then, each path extending from an initial vertex to a terminal vertex can be traced by following the corresponding sequence of concatenated edge labels. Assume further that all the vertices in the graph G are grouped into sets, and that each vertex belongs to one of these sets.

The encoding and decoding algorithms shown in the flow charts of FIGS. 3 and 4 provide an invertible code mapping which maps input integers to sequences of concatenated edge labels corresponding to paths from each $v_0 \epsilon I$ to T. Of these sequences, a certain subset C, defined by various coding constraints, is allowed to be used in the code. Each sequence $c \epsilon C$ will be called a codeword.

For each vertex $v_i$, there is a set of subsequences $S_i$ of concatenated edge labels describing paths to vertices in T. Of these subsequences, a certain subset $C_i$ is the set of subsequences which, by themselves, satisfy the various coding constraints as ending subsequences. Let $N_i$ be the number of subsequences in $C_i$. Some of the numbers $N_i$ are used as the thresholds t in the flow charts of FIGS. 3 and 4. Some of the subsequences in $C_i$ may not be arbitrarily concatenated with a beginning subsequence corresponding to a path to $v_i$ without violating the coding constraints. For each $v_t \epsilon T$, there is exactly one (empty) valid subsequence describing a path to a vertex in T, so $N_t = 1$. By definition, $N_0$ is the number of codewords starting in vertex $v_0$. The numbers $N_i$ can be arranged in a table which is doubly indexed by the set that vertex $v_i$ belongs to and by the number of edges traversed from $v_i$ to T.

For each vertex $v_i$, let $E_i$ be the set of edges leaving $v_i$. Let $e_{i,j}$ denote an edge from $v_i$ to $v_j$. It is essential that upon arrival at $v_i$, a particular edge $e_1$ from the set of edges in $E_i$ going from $v_i$ to $v_{jl}$ can be selected such that all sequences formed by concatenating the beginning subsequence corresponding to the path to $v_i$, the edge label for $e_1$, and a subsequence in $C_{jl}$, are valid codewords. The label of edge $e_1$ is called the preferred state transition label, and the set which contains $v_{jl}$ is called the preferred successor state set.

Lemma

Let $G=(V,E)$ be as described above. The encoder algorithm provides a mapping between integers in the range $0 \leq a < N_0$ and valid codewords; and the decoder algorithm provides the inverse mapping from each codeword to the appropriate integer.

Proof

Let $S_0 = a$, with $0 \geq a < N_0$.

With the described edge ordering for $E_0$, let $e_i$ denote the ith edge (from $v_0$ to $v_{ji}$), and $N_i$ denote the number of sequences in $C_{ji}$. Then, by definition, $$N_0 = N_1 + z$$

where z is the number of sequences in $C_{j2}$ which can be concatenated with the beginning sequence and legitimately used in the code and $0 \leq z < N_2$. Then, there exists k with $1 \leq k \leq 2$ such that $$S_0 < \sum_{i=1}^{k} N_i,$$

and the encoder algorithm issues $l_k$, the edge label for $e_k$.

If $k=2$, $S_0$ is replaced by $S_l$ which equals $S_0 - N_1$. However, if $k=1$, $S_1 = S_0$. Since $l_k$ uniquely identifies the edge $e_k$, the decoder can use this information to recover the difference $(S_0 - S_1)$.

If $k=1$, $0 \leq S_1 < N_1$; whereas if $k=2$, $0 \leq S_1 < z$. In either case, there are at least $S_l$ concatenable subsequences from $v_{jk}$ available to form codewords. The algorithm can therefore continue with $v_{jk}$ taking the role of $v_0$; $N_k$ or z taking the role of $N_0$; and $S_l$ taking the role of $S_0$.

In each iteration, $S_i$ is replaced by $S_{i+1}$. When the last edge is taken in an n edge path to T, $0 \leq S_n < N_t = 1$; i.e., $S_n = 0$. Selection of the nth edge label determines the unique coded sequence for the integer a to be encoded. The decoder identifies $e_n$ and recovers $S_{n-1} - S_n$.

Since $a = S_0 = (S_0 - S_1) + (S_1 - S_2) + ... + (S_{n-1} - S_n) + S_n$, the decoder reconstructs a by taking the appropriate running sum.

I claim:

1. A method for lexicographically coding indicia in a state-dependent code between user data and a coded sequence thereof; comprising the steps of:
   (a) providing a coding trellis having a plurality of sets of states, each state in each set having a respective threshold equal to the number of valid code subsequences from that particular state to the end of the trellis;
   (b) determining a path through the trellis corresponding to a current state; and
   (c) recursively using the thresholds corresponding to successive current states to provide an invertible mapping between the user data and coded sequence thereof.

2. The method of claim 1, including
   determining the path by comparing successive thresholds with a series of numbers recursively generated during step (c) for encoding the user data into the coded sequence.

3. The method of claim 1, wherein the states of the trellis are connected by edges with labels; and the path is determined by comparing successive edge labels to successive bits of the coded sequence for decoding the sequence into the user data.

4. A method for lexicographically encoding an n-bit input string of binary data, which is in a state-dependent code, for use on a binary storage channel to provide an output in the form of coded subsequences having a preselectable coding rate, said method comprising the steps of:
   (a) providing a coding trellis having a plurality of sets of states, and meeting preselected modulation constraints defining for each state in each set a respective threshold equal to the number of valid code subsequences from that particular state to the end of the trellis; and (b) encoding the input string by comparing a number x corresponding initially to a binary representation of the input to the threshold for a potential next state in a predetermined preferred one of said sets;

(c) using the result of said comparison,
   (1) determining a next state and an output bit thereof;
   (2) deducting said predetermined one of said thresholds from x if x is greater than or equal to said predetermined threshold to derive a number x' to be used in place of x; and (d) recursively repeating steps (b) and (c) until n input bits have been encoded.

5. The method of claim 4, wherein the preferred set is that set for which all of the valid code remaining subsequences, when concatenated with a most recent subsequence of the output bits, will satisfy the preselected modulation constraints.

6. The method of claim 4, wherein the next state is in the same or a different one of said sets of states.

7. A method for lexicographically encoding an n-bit input string of binary data, in a state-dependent code, for use on a binary storage channel to provide an output in the form of coded subsequences having a preselectable m/n coding rate, said method comprising the steps of:

(a) providing a coding trellis having at least two sets of states interconnected by edges with labels;

(b) while in one state, setting a number x equal to a number i to be encoded, where $0 \leq i < 2^m$;

(c) comparing x to a threshold t determined from preselected modulation constraints corresponding to the number of valid ending subsequences from a state in a preferred successor set to the end of the coding trellis;

(d) if x<t, following a preselected edge e with an output bit which is the label thereof to said state in said preferred successor set;

(e) if x≥t, following a different edge e with an output bit which is the label thereof to a different state and generating a new number x'=x−t to be used in place of x; and (f) recursively repeating steps (c) and (d) or (e) until n output bits have been encoded.

8. The method of claim 7, wherein the preferred set is that set for which all of the valid code remaining subsequences, when concatenated with a most recent subsequence of the output bits, will satisfy the preselected modulation constraints.

9. The method of claim 7, wherein the input string is in NRZI code notation.

10. The method of claim 7, wherein the input string is in NRZ code notation.

11. The method of claim 7, wherein the threshold t limits the run length of NRZI zeros in the state-dependent code.

12. The method of claim 7, wherein the threshold t limits the run length of running digital sums of streams of NRZ encoded bits.

13. A method for lexicographically decoding an n-bit input string of coded bits in a state-dependent code into an n-bit block of user bits comprising the steps of:

(a) providing a coding trellis having a plurality of sets of states, each state in each set having a respective threshold equal to the number of valid code subsequences from that particular state to the end of the trellis; and (b) using a succession of the coded bits, determining a path of successive current states through the trellis; and (c) selectively combining the thresholds for a succession of then current states to provide the n-bit block of user bits in decoded form.

14. A method for lexicographically decoding to a number x an n-bit coded output string, in a state-dependent code, from a binary storage channel, said method comprising the steps of:

(a) providing a coding trellis having a plurality of sets of states, each state in each set having a respective threshold equal to the number of valid code subsequences from that particular state to the end of the trellis;

(b) after initially setting x equal to zero, decoding the input string by conditionally adding to x a succession of predetermined ones of said thresholds;

(c) by following a path through the coding trellis,
   (1) determining a successor state; and
   (2) if the successor state is not in a preferred one of said sets, adding to x the threshold equal to the number of valid code subsequences to the end of the trellis for the state in the preferred one of said sets to derive a number x' to be used in place of x;

(d) recursively repeating step (c) until all n of the input bits have been decoded; and (e) outputting the accumulated number x as determined in step (d).

15. A method for lexicographically decoding to a number x an n-bit input string, in a state-dependent code, from a binary storage channel that provided an output in the form of coded subsequences with a preselectable coding rate, said method comprising the steps of:

(a) providing a coding trellis having at least two sets of states interconnected by edges with labels;

(b) while in one state, setting x equal to zero;

(c) determining, in each set of states, a preferred edge;

(d) comparing the label of the preferred edge to that of a next input bit;

(e) if the labels do not correspond, adding a preselected threshold t to x to generate a new number x' to be used in place of x; the threshold t being determined from preselected modulation constraints corresponding to the number of valid ending subsequences from a state in a preferred successor set to the end of the coding trellis;

(f) following the edge label corresponding to the input bit to a successor state;

(g) recursively repeating steps (c) through (f) until all n outputs of the input bits have been decoded; and (h) thereafter outputting the number x as determined in step (g).

16. The method of claim 15, wherein the input and output strings are in NRZI code notation and the preferred edge has a label of "1".

17. The method of claim 15, where the input string and output string are in NRZ code notation and the preferred edge has a label which is the complement of the label of that edge just processed.

18. A method of coding a binary input string to provide an output in NRZ representation meeting, said method comprising the steps of:

(a) providing a coding trellis having a plurality of sets of states and preselected code paths between said states and preselected modulation constraints defining for each state in each set a respective threshold equal to the number of valid code subsequences from that particular state to the end of the trellis;

(b) encoding the input string into encoded subsequences; and (c) whenever a choice of paths is offered, locally reordering said encoded subsequences to give preference to a successor state that permits concatenation of a most recent encoded subsequence with all subsequences from the successor state to the end of the trellis that do no violate the modulation constraints.

19. Apparatus for lexicographically coding indicia in a state-dependent code between user binary data and a coded sequence thereof, comprising:

(a) a read only memory providing a coding trellis having a plurality of sets of states, each state in each set having a respective threshold equal to the number of valid code subsequences from that particular state to the end of the trellis;

(b) means for determining a path through the trellis corresponding to a current state; and (c) means recursively responsive to the thresholds corresponding to successive current states to provide an invertible mapping between the binary data and the coded sequence.

20. The apparatus of claim 19, wherein said recursively responsive means generates a series of numbers, and including means for comparing successive thresholds with said series of numbers for encoding the user binary data into the coded sequence.

21. The apparatus of claim 19, wherein the states of the trellis are connected by edges with labels, and including means for comparing successive edge labels to successive bits of the coded sequence for decoding said sequence into the user binary data.

* * * * *

UNITED STATES PATENT AND TRADEMARK OFFICE
CERTIFICATE OF CORRECTION

PATENT NO. : 5,208,834
DATED : May 4, 1993
INVENTOR(S) : Lyle J. Fredrickson

It is certified that error appears in the above-identified patent and that said Letters Patent is hereby corrected as shown below:

Title page, item 19: under "United States Patent", "Frederickson" should be corrected to --Fredrickson--.

Title page of patent, listing of Inventor:, "Frederickson" should be --Fredrickson--.

Column 8, chart at bottom of page, in second column from left on the chart, seventh number down, the "0" should be --1--.

Column 16, line 64, delete "meeting".

Signed and Sealed this

Fifteenth Day of March, 1994

Attest:

BRUCE LEHMAN

Attesting Officer

Commissioner of Patents and Trademarks